(12) United States Patent
Keefe et al.

(10) Patent No.: US 8,138,880 B2
(45) Date of Patent: Mar. 20, 2012

(54) PERSISTENT CURRENT SWITCH

(75) Inventors: George A. Keefe, Cortlandt Manor, NY (US); Roger H. Koch, Amawalk, NY (US); Inga Koch, legal representative, Amawalk, NY (US); Frank P. Milliken, Jr., Tarrytown, NY (US); James R. Rozen, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 849 days.

(21) Appl. No.: 12/182,411

(22) Filed: Jul. 30, 2008

(65) Prior Publication Data

US 2010/0026447 A1 Feb. 4, 2010

(51) Int. Cl.
*H01L 39/18* (2006.01)
*H01L 39/20* (2006.01)

(52) U.S. Cl. .......... 338/32 S; 361/19; 361/141; 335/216

(58) Field of Classification Search .................. 338/32 S; 335/216; 361/331, 385, 379, 19, 141
See application file for complete search history.

(56) References Cited

U.S. PATENT DOCUMENTS

| | | | | |
|---|---|---|---|---|
| 3,308,310 A | * | 3/1967 | Burnett ......................... | 327/366 |
| 3,707,670 A | * | 12/1972 | Erdman ........................ | 323/297 |
| 4,021,633 A | | 5/1977 | Kuwabara et al. | |
| 4,164,777 A | * | 8/1979 | Kneip et al. ................... | 361/837 |
| 4,586,017 A | | 4/1986 | Laskaris et al. | |
| 5,680,085 A | | 10/1997 | Aihara et al. | |
| 6,317,303 B1 | | 11/2001 | Zeigler et al. | |
| 2007/0263328 A1 | | 11/2007 | Jonas et al. | |

FOREIGN PATENT DOCUMENTS

JP 11340533 12/1999

OTHER PUBLICATIONS

P. Balchandani et al., "Thin-Film Persistent Current Switch," IEEE Transactions on Applied Superconductivity, Sep. 2005, pp. 3821-3826, vol. 15, No. 3.
A.C. Leuthold et al., "Characterization of a Simple Thin-Film Superconducting Switch," IEEE Transactions on Applied Superconductivity, Sep. 1994, pp. 181-183, vol. 4, No. 3.

* cited by examiner

*Primary Examiner* — Kyung Lee
(74) *Attorney, Agent, or Firm* — Vazken Alexanian; Ryan, Mason & Lewis, LLP (57) ABSTRACT

An improved persistent current switch design and method of operation are disclosed. By way of example, a persistent current switch circuit comprises a heating element and a switch element located proximate to the heating element, the switch element being substantially formed from a material (by way of example only, titanium) which exhibits a superconducting temperature value below a superconducting temperature value exhibited by a material (by way of example only, aluminum) used to provide a connection to the switch element. The switch element is responsive to the heating element such that the heating element is used to control whether or not the switch element is in a superconducting state. The switch element may also have a folded geometry. Such persistent current switches exhibit low power and low inductance.

25 Claims, 9 Drawing Sheets

PERSISTENT CURRENT SWITCH

FIELD OF THE INVENTION

The present invention relates to thin film superconducting persistent current switches and, more particularly, to low power, low inductance thin film superconducting persistent current switches.

BACKGROUND OF THE INVENTION

It is known that quantum computation devices (also referred to as "qubits") need high precision magnetic bias signals to accurately set the operating point of the device. Control currents on the order of 10 milliAmps (mA) are required, with an accuracy of one part in a million, and the noise temperature of the control electronics must be low to avoid decohering the qubit. Because the qubit is operated at temperatures near 20 milliKelvin (mK), the usual way of directly coupling control signals to the quantum bit will heat the refrigerator and inject undesirable noise into the device. The simplest way to solve these problems is to use a thin film superconducting persistent current switch. Examples of such persistent current switches are disclosed in A. C. Leuthold, R. T. Wakai, G. K. G. Hohenwarter, and J. E. Nordman, "Characterization of a Simple Thin-Film Superconducting Switch," IEEE Trans. Appl. Supercond., vol. 4, no. 3, pp. 181-183, 1994; and P. Balchandani, R. H. Torii, and R. Shile, "Thin-Film Persistent Current Switch," IEEE Trans. Appl. Supercond., vol. 15, no. 3, pp. 3821-3826, 2005, the disclosures of which are incorporated by reference herein.

The standard switch design described in the existing literature involves joule heating a thin film superconducting niobium (Nb) line using a thin film heater which crosses the Nb line. To reduce the amount of power needed to operate the switch, the overlap area typically is 100 micrometers ($\mu$m)$\times$100 $\mu$m. The amount of power needed to operate the switch is about 50 microWatts ($\mu$W).

SUMMARY OF THE INVENTION

Principles of the invention provide an improved persistent current switch design and method of operation.

In a first embodiment, a persistent current switch circuit comprises a heating element and a switch element located proximate to the heating element, the switch element being substantially formed from a material which exhibits a superconducting temperature value below a superconducting temperature value exhibited by a material used to provide a connection to the switch element. The switch element is responsive to the heating element such that the heating element is used to control whether or not the switch element is in a superconducting state. The switch element is preferably formed to minimize an inductance value associated therewith. The inductance value of the switch element may be minimized by forming the switch element in accordance with a folded geometry. The switch element is preferably substantially formed from titanium and the heating element is preferably substantially formed from a combination of gold and palladium.

In a second embodiment, an apparatus comprises a heating element and a switch element located proximate to the heating element, the switch element being substantially formed from a material which exhibits a superconducting temperature value below a superconducting temperature value exhibited by a material used to form a connection element that provides a connection to the switch element. The switch element is responsive to the heating element such that the heating element is used to control whether or not the switch element is in a superconducting state. Further, the apparatus preferably comprises a coupling element operatively coupled across the switch element, and a device operatively coupled to the coupling element, wherein the device comprises a quantum computation device. Still further, the heating element and the switch element may be formed on a first substrate and the coupling element and the device formed on a second substrate.

In a third embodiment, an integrated circuit comprises a substrate layer, a heating element layer formed on the substrate layer, and a switch element layer formed proximate to the heating element layer, the switch element layer being substantially formed from a material which exhibits a superconducting temperature value below a superconducting temperature value exhibited by a material used to provide a connection to the switch element. The switch element layer is responsive to the heating element layer such that the heating element layer is used to control whether or not the switch element layer is in a superconducting state. Preferably, the switch element is substantially formed from titanium, and the heating element layer is substantially formed from a combination of gold and palladium. An insulator layer may be formed between the heating element layer and the switch element layer. The insulator layer is preferably substantially formed from silicon nitride. Two balanced heater current wiring paths may be formed on the substrate. The two balanced heater current wiring paths are preferably substantially formed from niobium. The heating element layer and the switch element layer are preferably formed so as to allow external connections via aluminum wire bonds.

In a fourth embodiment, a method comprises the following steps. A first current is applied to a heating element located proximate to a substantially titanium-formed switch element such that the switch element is warmed above a superconducting transition temperature associated therewith. A control signal is introduced such that the control signal flows substantially entirely through a coupling element operatively coupled to the switch element. The first current applied to the heating element is removed such that the switch element closes when the switch element cools below the superconducting transition temperature thereby allowing a second current to flow persistently through the switch element and the coupling device, and thus allowing an operating characteristic associated with a device operatively coupled to the coupling element to be maintained. The method may further comprise the step of removing the control signal. The device may comprise a quantum computation device and the operating characteristic may comprise a magnetic flux bias point for the quantum computation device.

In a fifth embodiment, a design structure embodied in a machine readable medium comprises a heating element and a switch element located proximate to the heating element, the switch element being substantially formed from a material which exhibits a superconducting temperature value below a superconducting temperature value exhibited by a material used to provide a connection to the switch element, wherein the switch element is responsive to the heating element such that the heating element is used to control whether or not the switch element is in a superconducting state.

Advantageously, principles of the invention provide for low power, low inductance thin film superconducting persistent current switches.

These and other objects, features and advantages of the present invention will become apparent from the following detailed description of illustrative embodiments thereof, which is to be read in connection with the accompanying drawings.

DETAILED DESCRIPTION

In accordance with illustrative principles of the present invention, it has been realized that, for qubit experiments, the standard switch design (as described above in the background section) has three undesirable features. First, the cooling power of most dilution refrigerators at 20 mK is typically less than 10 µW. Therefore, a switch that dissipates 50 µW of power will warm the refrigerator and the qubit if it is "on" or "open" for too long. Second, the inductance of the typical switch is too large in comparison to the inductance of the current bias control line that sets the qubit. In this case, a large fraction of the noise current from the room temperature control electronics is coupled to the qubit when the switch is "off." Finally, the mutual inductance between the heater circuit and the persistent current switch is large and therefore this limits ones ability to set the control current accurately.

A persistent current switch design according to illustrative principles of the invention described herein solves the above and other problems. For example, key design improvements in the inventive persistent current switch are as follows.

First, we address the heating problem. Illustrative principles of the invention propose to solve this problem by utilizing a switch element (or "strap") made of a material which exhibits a superconducting temperature value (also known as a critical temperature abbreviated $T_c$) "below" a superconducting temperature value exhibited by a material used to provide a connection to the switch element. It is to be appreciated that "below" in this case is defined as being "at least about half." Accordingly, the material of the switch element exhibits a superconducting temperature value that is at least about half of the superconducting temperature value exhibited by the material used to provide a connection to the switch element. It is to be appreciated that the lower the superconducting temperature value is, the less power is needed to drive the material normal.

In addition, the switch element should have a superconducting temperature value that is above the operating temperature of the qubit. This can mean marginally below or significantly below. By way of example, in an embodiment described below, the qubit operates at 20 mK (0.02K), while the superconducting temperature of various illustrative materials that may be used for the switch element are, e.g., between about 0.11 K and about 0.61 K. Thus, it is to be appreciated that the temperature of the experimental chip (in this case, the qubit) merely needs to be below the $T_c$ of the switch element material (note that when the switch is closed, i.e., the titanium is superconducting, the experimental chip and the switch are both below the $T_c$ of the Ti). There would only be a problem if the experiment produces so much heat that the switch element material goes normal. But this will not occur in accordance with principles described herein since, first, the experimental chip is very weakly coupled thermally to the switch chip; and, second, we would not put enough current into the experimental chip to heat it significantly because it would not then stay at the low temperature which we want it to be at.

While, in a preferred embodiment as will be described below, we use titanium (Ti) for the material of the switch element due to its $T_c$ of about 0.4 Kelvin (0.39 K), as compared with the $T_c$ of a connection material such as aluminum, there are other suitable alternatives. For example, other possible materials for the switch element include but are not limited to: Gold-Indium-AuIn2 (0.21 K), Zirconium-Zr (0.61 K), Ruthenium-Ru (0.49 K), and Iridium-Ir (0.11 K).

Thus as mentioned above, in a preferred embodiment, principles of the invention utilize a switch element (or "strap") made of Ti. It is to be understood that it is preferred that the entire switch element be made of Ti, but it is to be appreciated that benefits of the invention can be achieved with the switch element being substantially made (i.e., "substantially formed") of Ti. Note that this point applies to the respective compositions of the various other elements of the persistent current switch of the invention.

The critical temperature $T_c$ (also known as the superconducting temperature since it is the temperature below which the element acts as a superconductor) of Ti is 0.39 Kelvin (K) which is significantly less than the $T_c$ of Nb (9.2 K), which is used for the switch element in existing designs. The much lower $T_c$ means that we can drive the Ti into its resistive state using much less power. This also means that one must have a cryogenic system that cools to temperatures below 0.39 K. This can be accomplished using the same dilution refrigerator used to cool the qubits. One other important factor that we will discuss in more detail below is that the $T_c$ of Ti is also much less than the $T_c$ (1.2 K) of the aluminum (Al) wire bonds used to connect the heat switch to the current bias control circuit. If the Al bonds are resistive or in their "normal" state, the heat switch will then be cooled by the "cold" qubit chip and therefore more heat is needed to open the switch. With the inventive design, we can open the switch using only 0.6 µW. This is 80× less than existing designs.

Furthermore, the superconducting Ti "strap" is designed to have a very low inductance. This is done using a large width to length ratio and then folding the strap with as narrow a slot as possible to keep its inductance low. The folding allows the interconnect pads to be close to each other and therefore the wire bonds to the qubit chip can be short and low in inductance. An illustrative embodiment of the Ti strap will be described below in the context of FIG. 2. The inductance of the heat switch is roughly 600 picoHenries (pH) which is about 1/10 the inductance of the current bias "coupling" coil plus wire bonds. When the switch is closed, any noise currents are now shunted mostly through the heat switch instead of the coupling coil.

Another design improvement concerns the heater circuit. Illustrative principles of the invention propose to use gold-palladium (AuPd) for the resistive material. More importantly, we use a balanced current feed that provides a gradiometric cancellation of the stray magnetic fields coupling the heater circuit to the switch strap.

Figure 1A:
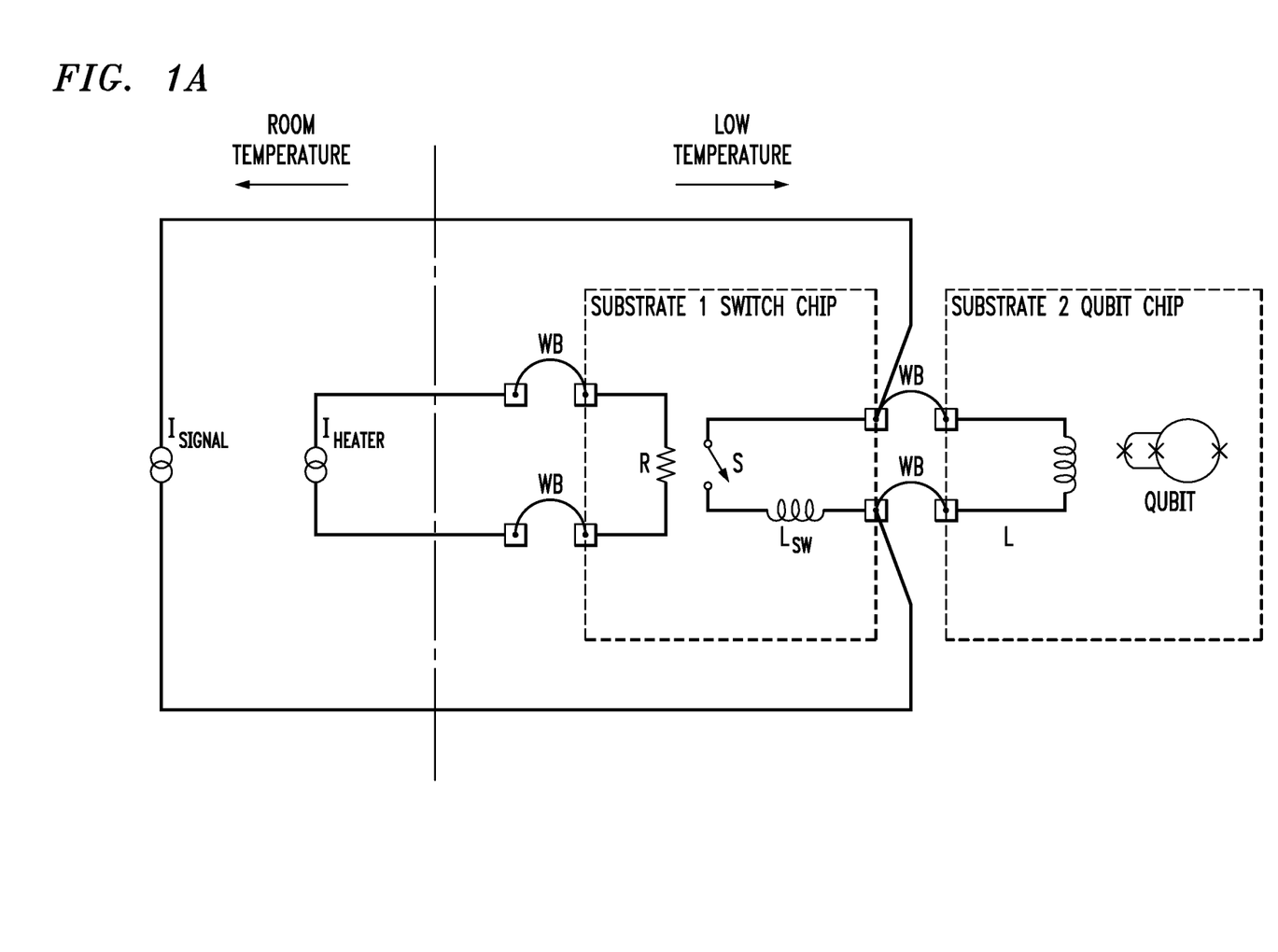
FIG. 1A shows an overall schematic view of a persistent current switch and operating environment according to an embodiment of the invention.

FIG. 1A shows an overall schematic view of a persistent current switch according to an embodiment of the invention.

In particular, FIG. 1A shows the switch integrated circuit or chip, the qubit integrated circuit or chip and the room temperature electronics needed to supply currents to the heater R and the current bias loop L. The switch chip and the qubit chip (each denoted by dashed lines) are mounted on a sample holder that is cooled in a cryogenic system to temperatures T near 20 mK (0.02 K). Our goal is to apply a fixed control current through L. It is important that this current be very precise and free of spurious noise currents. L is a lithographically deposited planar Nb loop. Current in this loop couples magnetic flux to the qubit. We may therefore generally refer to loop L as coupling element L. This flux biases the qubit at the correct operating point of the device. R is a AuPd heater and S is a Ti strap. Both are deposited using photo-lithography. More details about the switch chip will be presented below. All connections to the two chips are made via Al wire bonds WB.

The current through L is persisted as follows. We first apply current to the heater R until the strap S is warmed above its superconducting transition temperature ($T_c$=0.39 K). We note that it is important that we do not apply so much heat that the Al wire bonds rise above their transition temperature (1.2 K). Otherwise there will be heat transferred between the switch chip and the qubit chip. This would cause the qubit chip to warm, and, it would cool the switch chip. This could then cause the switch to close unless we apply more heat. These problems are easily avoided since we have a large temperature window (0.39-1.2 K) with which to work.

The control current $I_{signal}$ is then turned on. Since R is now resistive all of $I_{signal}$ flows through L. At this point there is a large current flowing through L and the qubit is strongly coupled to noise sources in the room temperature electronics. While the control current is flowing, the current to the heater is turned off and the switch S closes when the strap cools below its superconducting transition temperature. Now the entire circuit including the switch strap S, the coupling coil L, and the interconnecting wire bonds WB comprise a completely superconducting circuit and as such will allow current flowing in it to persist indefinitely. The control signal current source can be turned off and disconnected if desired and the magnetic flux bias point for the qubit maintained.

While the switch S is closed, all currents, including noise currents from the signal source at room temperature, will be divided between the coupling coil L and the switch strap. Consider the schematic shown in FIG. 1B.

Figure 1B:
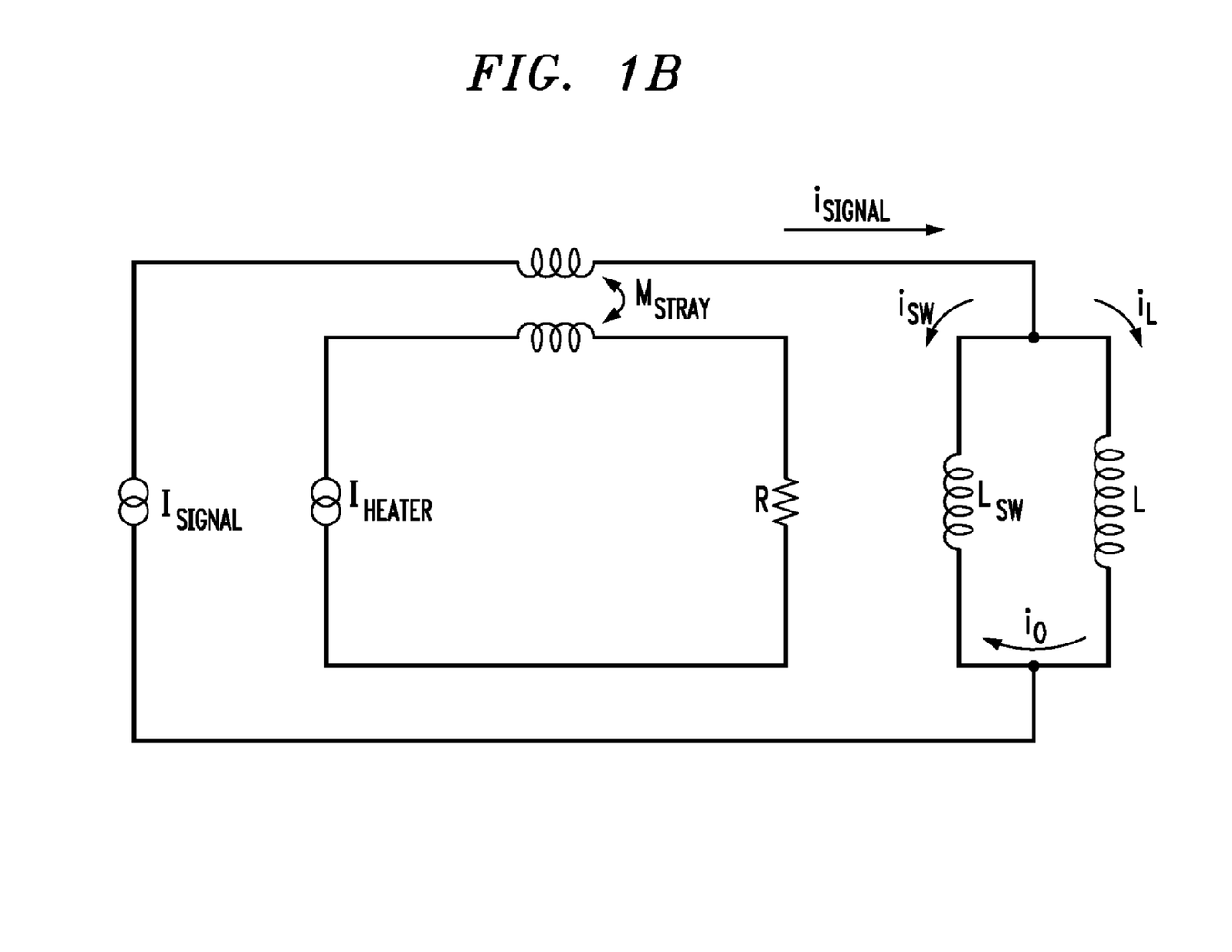
FIG. 1B shows an equivalent schematic view of the persistent current switch of FIG. 1A when the switch S is closed.

The division of current will occur according to the following formula: $(i_{SW})(L_{SW})+(i_L)(L)=0$. This formula merely states that the magnetic flux in the superconducting loop cannot change. Because the inductance of the switch strap has been designed to be about ten times lower than the inductance of the coupling coil plus wire bonds, the noise currents going through L will be attenuated by that same factor as well. We have confirmed this result directly in our experimental setup. Also shown in FIG. 1B is the stray mutual inductance $M_{stray}$ between the heater circuit and the signal circuit. Any currents in the heater circuit will be partially coupled to the signal circuit and will appear as additional current noise in the superconducting loop. For this reason, the heater circuit should be designed such that $M_{stray}$ is minimized. An example of how this can be done in our case will be explained now in the context of FIG. 2.

Figure 2:
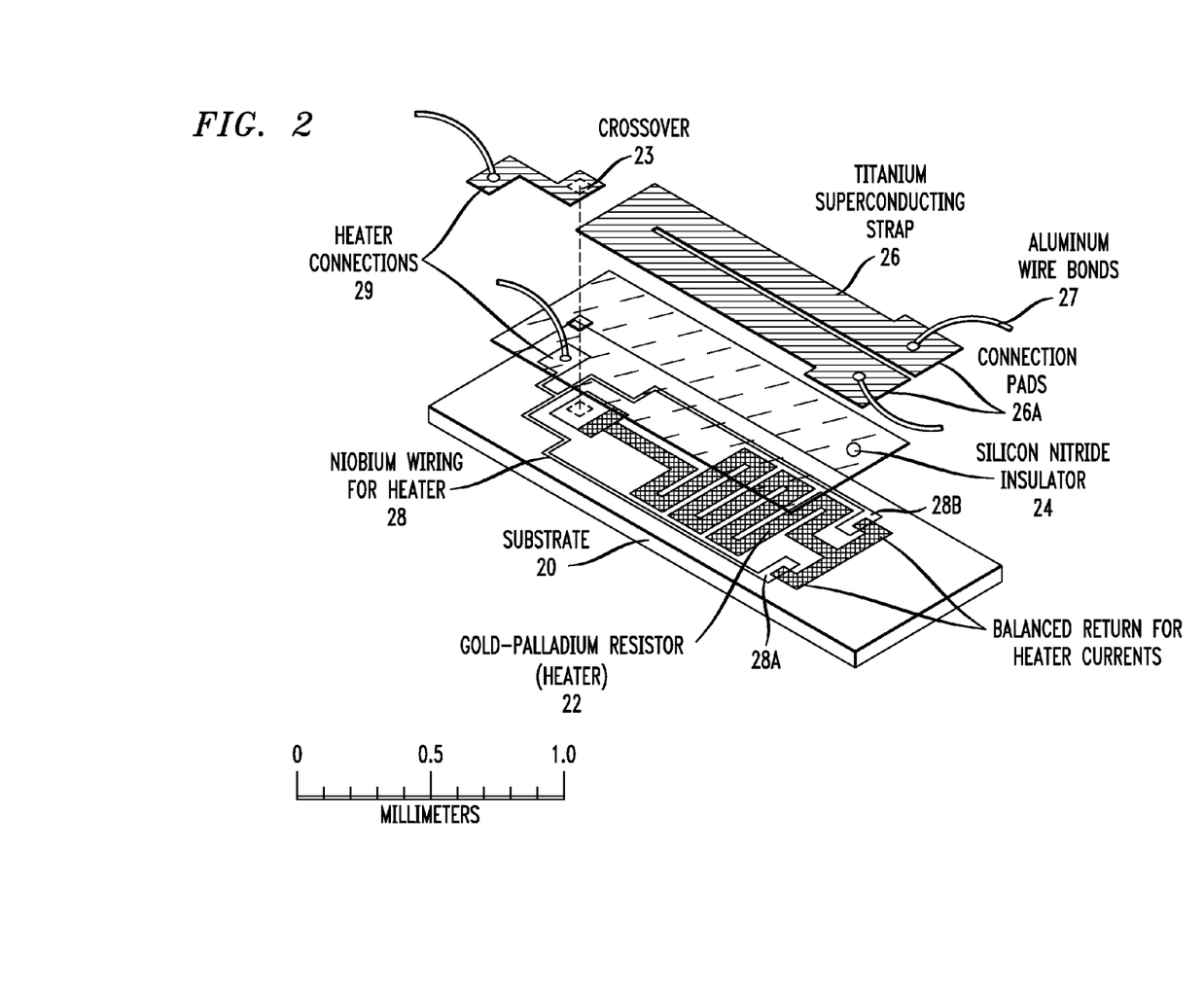
FIG. 2 shows a persistent current switch integrated circuit according to an embodiment of the invention.

FIG. 2 shows an exploded view of the switch integrated circuit or chip (denoted by the leftmost dashed-line box in FIG. 1A). The switch comprises three layers on top of an electrically insulating substrate. The substrate (20) is about 300 μm thick and is usually made of undoped silicon (Si). Next is a patterned AuPd resistor (22) that is about 300 Angstroms (A) thick. Even though AuPd is more difficult to evaporate, it has a higher resistivity which allows us to use lower heater bias currents. This is desirable due to $M_{stray}$. Also, for the same reason, we made the AuPd layer fairly thin so that R would be large. This is followed by about 1000 A of insulating Silicon Nitride (SiNi) layer (24). The final layer (26) is a patterned Ti layer about 2000 A thick. This is the superconducting strap and the "folded" geometry allows a low-inductance connection between the strap and the coupling coil L. The aluminum wire bonds (27) are connected to connection pads (26A). The return wiring (28) for the heater (connected to switch chip via heater connections 29) is made using about 2000 A thick Nb. The return wiring is split into two paths (28A and 28B) to form a balanced connection so that $M_{stray}$ is minimized. There is also a crossover (23) for the heater. Finally, even though only one switch is shown on the substrate in FIG. 2, one may fabricate many switches on the same substrate.

In an illustrative embodiment, the basic "folded" geometry of the Ti strap 26 is one which achieves a low inductance layout. Ultimately, the dimensions used in this embodiment were determined by the size of the bonding pads 26A. To accommodate several bonds on each pad, if needed, the pads are about 230 microns× 190 microns. The length of the strap in this embodiment is determined by the size of the AuPd resistor 22 that is underneath the strap. Since one of our goals is to minimize the amount of current in the resistor and, given the heat leak through the wire bonds, this determined approximately the size of the heater (AuPd resistor 22). The width of each arm of the Ti strap is about 150 microns and the length is about 1200 microns. The gap between the two arms is about 20 microns, a size that is achievable with optical lithography—given the length of the strap. The two parallel arms of the strap with the gap between them is what forms the "folded" geometry.

Also, it is to be understood that, in the illustrative embodiment of FIG. 2, the widths of various components were determined based on the size of the two bond pads. Further, given that the AuPd resistor was 300 A thick, and given that we wanted about 300 ohms of resistance, these criteria determined the length of the resistor. Thus, the width and length of the Ti strap was determined based on these criteria.

We noted that the heat leak along the wire bonds 27 can be undesirable. Even when the wire bonds are superconducting, they still conduct some heat via phonon conduction. This problem becomes smaller the lower in temperature we go. While wire bond connections can use multiple wire bonds in order to give a lower inductance connection, we found that extra wire bonds could give an unacceptable heat leak. Thus, in a preferred embodiment, we use single wire bonds only.

Figure 3A:
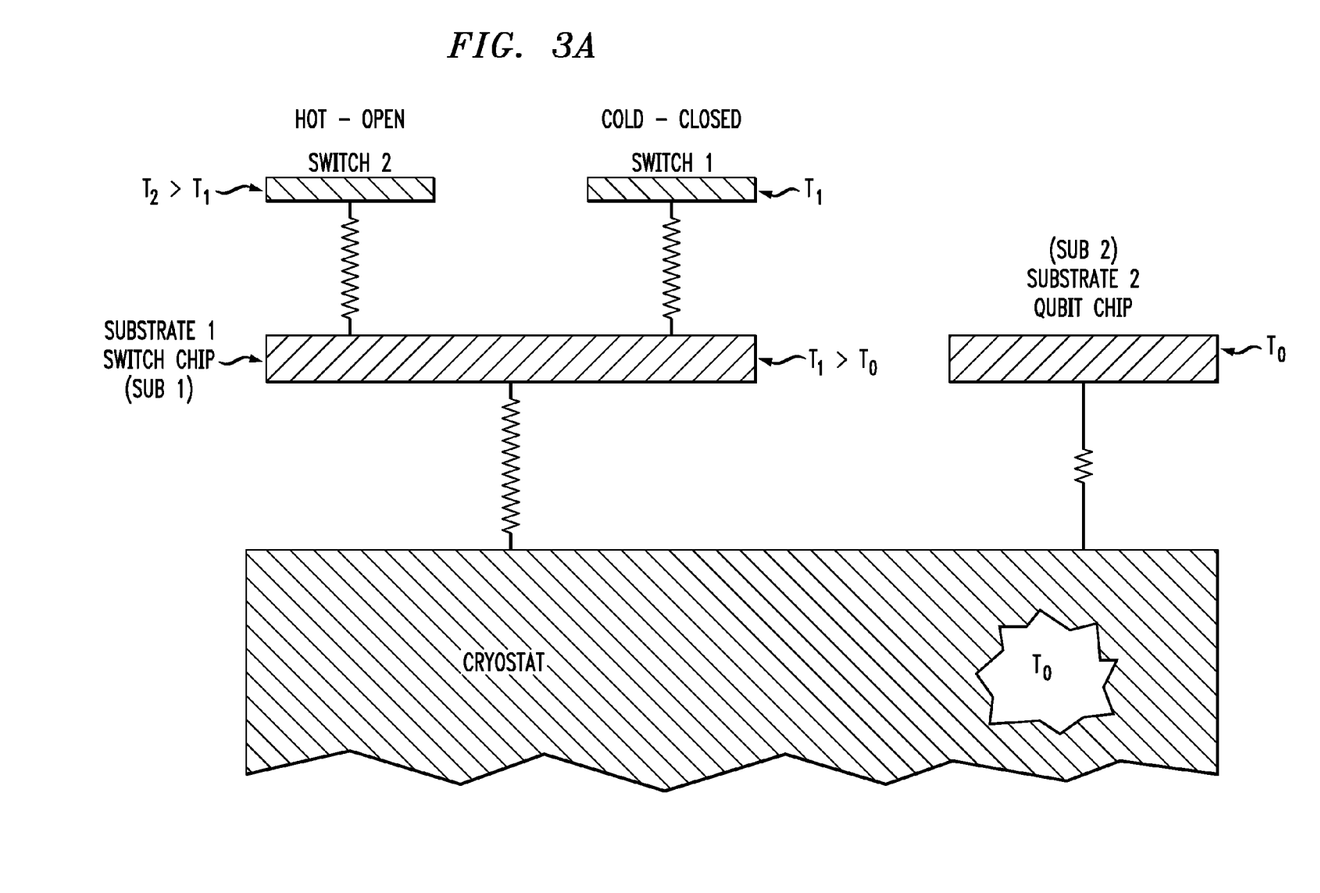
FIG. 3A shows schematically the heat flow between various components of the persistent current switch and its operating environment according to an embodiment of the invention.

The heat flow paths on the various substrates have been designed to accomplish several desired features. FIG. 3A shows schematically the heat flow between the various components.

It is important that the qubit be well thermally connected to the thermal reservoir at temperature $T_0$. Likewise, the coupling coil L must be superconducting at all times. Therefore, they are both placed on a substrate SUB2 that is connected to the cryostat with a very high thermal conductance. It is to be appreciated that the thermal conductivity (at low temperatures) should be similar to that of fairly pure copper. At very low temperatures, the conductivity of pure copper is in the range of 10 W/Km. Note the thermal conductivity of a material is related to the thermal conductance as follows: k=(L/A)/K, where k is the thermal conductivity, K is the thermal conductance, L is the relevant length, and A is the relevant contact area.

Figure 3B:
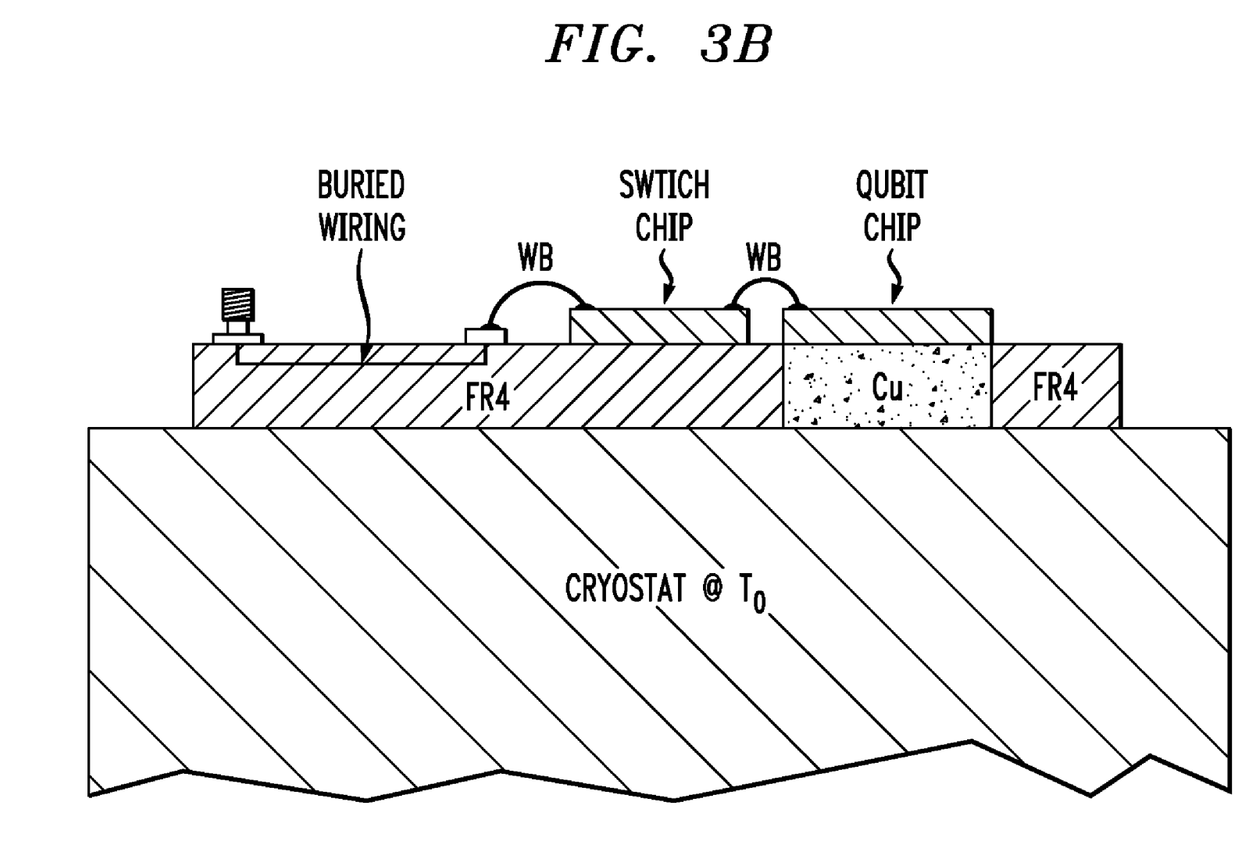
FIG. 3B shows schematically a persistent current switch integrated circuit and operating environment according to an embodiment of the invention.

The persistent current switch is deposited on a separate substrate SUB1 (item 20 in FIG. 2). SUB1 is attached to a material that has a low thermal conductance, e.g., FR4. The FR4 is screwed to the cryostat (shown in FIG. 3B). The persistent current switch is now thermally isolated from the cryostat and therefore when the heater warms the switch to a higher temperature T2 in order to drive it into the normal state, the qubit and coupling coil are not warmed appreciably. At low temperatures, the FR4 has a thermal conductivity less than 10-4 W/Km. We use FR4 because it is readily available and inexpensive. Other materials would work just as well, for example, vespel or nylon.

Also shown in FIG. 3A is the possibility that multiple switches may be deposited on SUB1 and that some switches may independently be open or closed. This can occur if the thermal conductance of SUB1 is small. Not shown in FIG. 3A are the thermal paths between the two substrates due to the aluminum wire bonds. If the temperature of the bonds stays well below 1.2 K, then the amount of heat transferred along each bond will be negligible.

In addition, with respect to FIG. 3A, it is to be understood that the upper small cross-hatched box (switch 1 or 2) is the titanium metal. The thermal impedance between it and SUB1 is the silicon nitride. The thermal impedance between SUB1 and the cryostat is the FR4.

We shall now discuss how we measure the amount of power needed to operate the inventive persistent current switch. To do this, we pass a small ac current through the Ti strap using an alternating current signal generator and a resistor. We also monitor the voltage across the Ti strap. If the heater power is low, the Ti strap is always superconducting and we observe no voltage drop across the Ti strap. We then increase the current through the AuPd heater. If the heater current is sufficiently large, then the temperature of the Ti will rise above its $T_c$ and the measured IV curve of the strap will look like a simple resistor. If we adjust the heater current carefully, the temperature of the Ti strap will be just below $T_c$ and the IV curve will exhibit a standard superconducting IV curve with a small critical current $I_c$. This is shown in FIG. 4.

Figure 4:
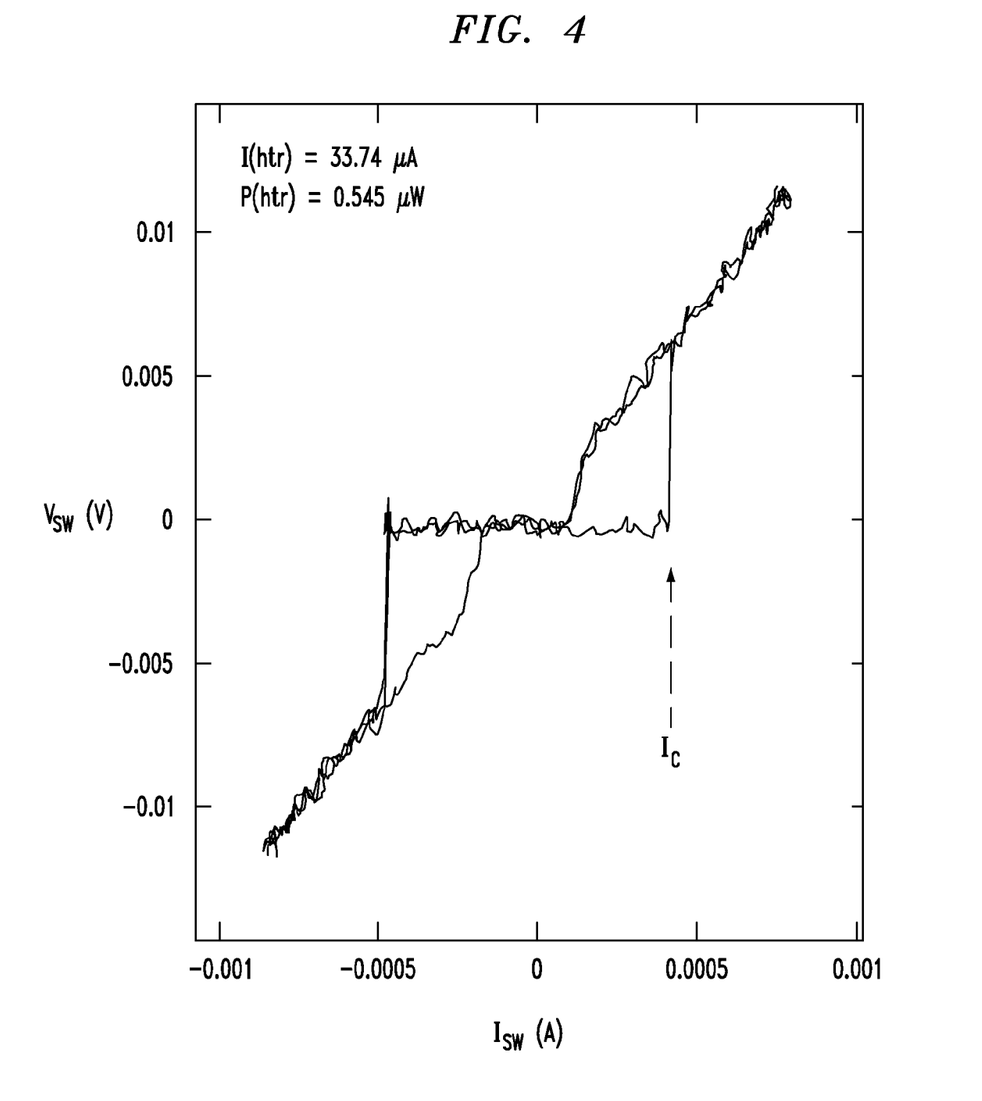
FIG. 4 shows an alternating current measurement of the current through a titanium switch element versus the voltage across the titanium switch element according to an embodiment of the invention.

FIG. 4 shows an ac measurement of the current through the Ti strap $I_{SW}$ versus the voltage across the Ti strap $V_{SW}$ where "SW" refers to "switch." In this case, the current through the AuPd heater is 33.74 µA. At low temperature, we measured R=479Ω and therefore roughly $P_{heater}$=(33.74×10−6) (33.74×10−6) (479)=0.545 µW. If we increase the power by less than 10%, we no longer observe a critical current. If we reduce the heater current to zero, then $I_c$ becomes very large (greater than 4 mA). We were unable to measure $I_c$ in this case because the large current needed to do this measurement would cause the cryostat to warm.

We note that if we were to use Al instead of Ti for the switch strap, the amount of power needed to operate the switch is substantially larger. There are two reasons why. First, the $T_c$ of Al is higher. More importantly, if we heat the Al strap enough to drive it normal, the Al wire bonds will also go normal, and now the switch chip is tightly coupled to the cold qubit chip. The qubit chip will then cool the switch chip and therefore more heater power is needed to keep the switch open. This extra power will heat both the qubit and the refrigerator which is undesirable. We have made persistent current switches using Al straps and the power needed is about 100 times more than when we use Ti straps.

There are several ways one might estimate the switching time of our persistent current switch. Since our switches are used in a cryogenic environment, the most reasonable measure is the thermal relaxation time. We have measured this time using the pulse scheme shown schematically in FIG. 5A.

Figure 5A:
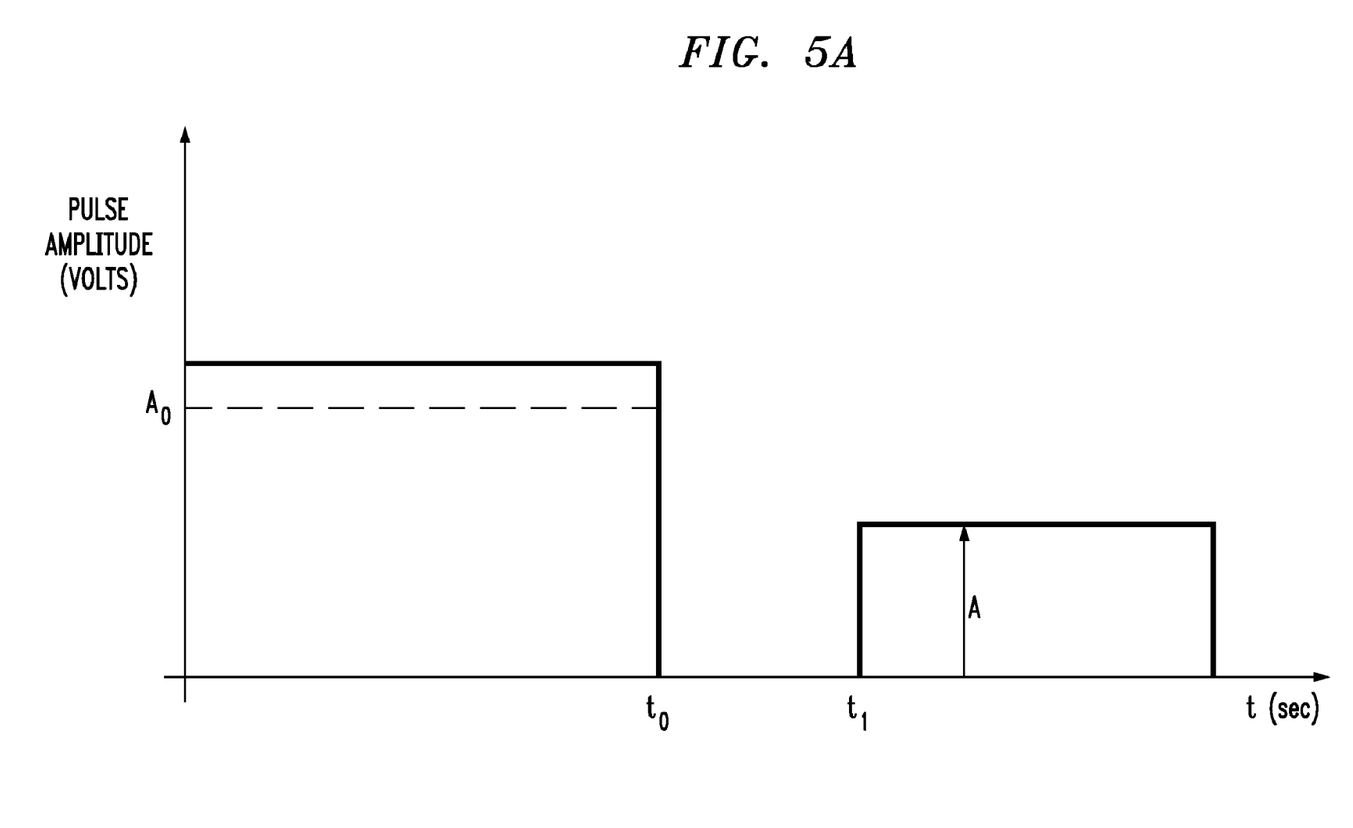
FIG. 5A a pulse scheme for measuring a thermal relaxation time associated with a persistent current switch according to an embodiment of the invention.

First we apply a very long voltage pulse to the switch heater R. The amplitude of the pulse is a little larger than the minimum voltage $A_o$ needed to cause the Ti strap to become resistive. While we are doing the pulsing, we also monitor the voltage across the Ti strap. Using a direct current power supply and a resistor, we pass current through the Ti strap. When the Ti is superconducting, and therefore not resistive, we observe no voltage. If the Ti is resistive, we then observe a non-zero voltage. The pulse is then turned off at a time $t_0$ and then, at a later time $t_1$, we pulse the switch again. The amplitude of the second pulse is adjusted until we just barely begin to see a voltage transient across the Ti strap. If $t_1-t_0$ is small, then the Ti strap has not cooled much and therefore the amplitude A needed to cause the strap to go normal again is small. If A is less than $A_o$, then the Ti strap will again go superconducting if t is much larger than $t_1$. In the limit $t_1-t_0$ is very large, the amplitude A will approach $A_o$.

Figure 5B:
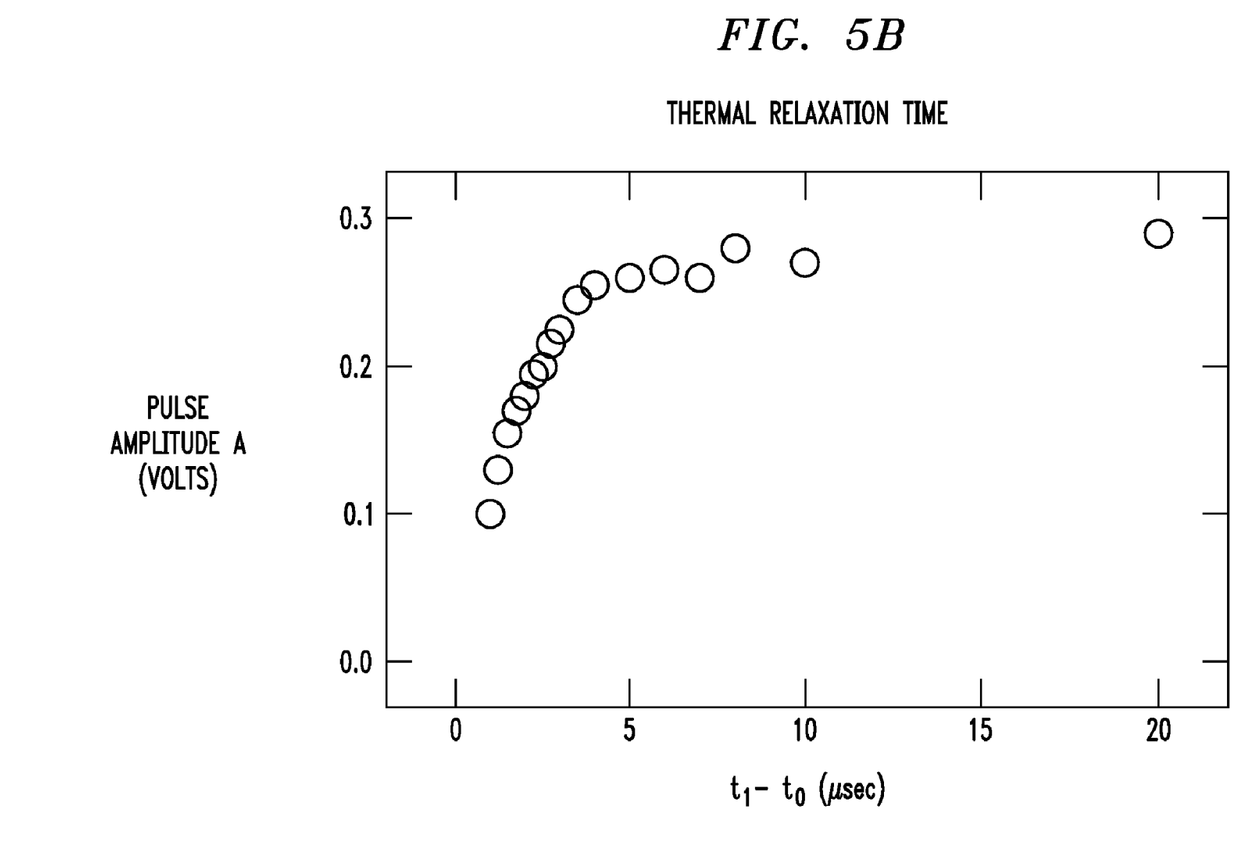
FIG. 5B shows a graphical representation of a measured thermal relaxation time associated with a persistent current switch according to an embodiment of the invention.

Our measurements of A versus $t_1-t_0$ are shown in FIG. 5B. FIG. 5B shows that the thermal relaxation time is about 4-5 µsec. This means that the switch can be used to set or reset the bias state of a qubit in about that time interval.

Figure 6:
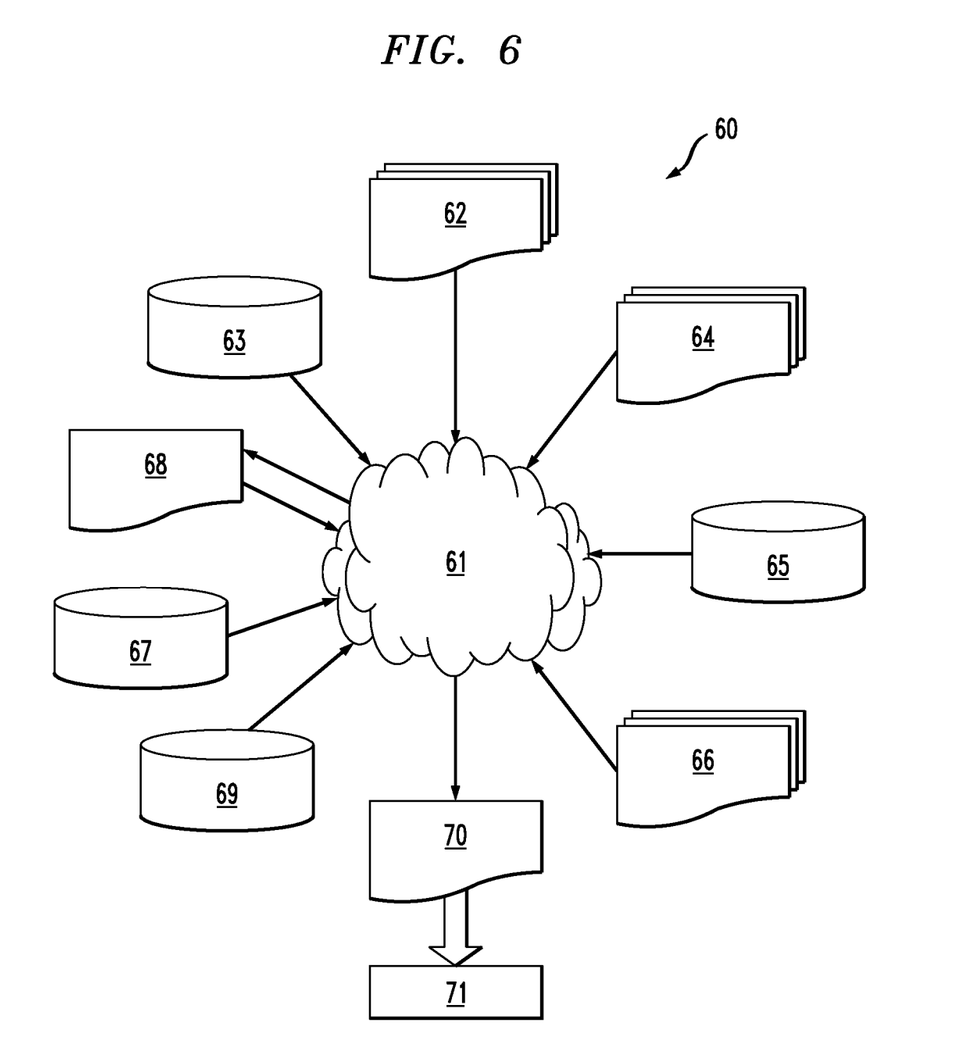
FIG. 6 shows an exemplary design flow used for example, in semiconductor design, manufacturing, and/or test, according to an embodiment of the invention.

FIG. 6 shows a block diagram of an exemplary design flow 60 used for example, in semiconductor design, manufacturing, and/or test. Design flow 60 may vary depending on the type of integrated circuit (IC) being designed. For example, a design flow 60 for building an application specific IC (ASIC) may differ from a design flow 60 for designing a standard component. Design structure 62 is preferably an input to a design process 61 and may come from an IC provider, a core developer, or other design company or may be generated by the operator of the design flow, or from other sources. Design structure 62 comprises an embodiment of the invention as shown in one or more of FIGS. 1A-3B in the form of schematics or HDL, a hardware-description language (e.g., Verilog, VHDL, C, etc.). Design structure 62 may be contained on one or more machine readable media. For example, design structure 62 may be a text file or a graphical representation of an embodiment of the invention as shown in one or more of FIGS. 1A-3B. Design process 61 preferably synthesizes (or translates) an embodiment of the invention as shown in one or more of FIGS. 1A-3B into a netlist 68, where netlist 68 is, for example, a list of wires, transistors, logic gates, control circuits, I/O, models, etc. that describes the connections to other elements and circuits in an integrated circuit design and recorded on at least one of the machine readable media. This may be an iterative process in which netlist 68 is resynthesized one or more times depending on design specifications and parameters for the circuit.

Design process 61 may include using a variety of inputs; for example, inputs from library elements 63 which may house a set of commonly used elements, circuits, and devices, including models, layouts, and symbolic representations, for a given manufacturing technology, design specifications 64, characterization data 65, verification data 66, design rules 67, and test data files 69 (which may include test patterns and other testing information). Design process 61 may further include, for example, standard circuit design processes such as timing analysis, verification, design rule checking, place and route operations, etc. One of ordinary skill in the art of integrated circuit design can appreciate the extent of possible electronic design automation tools and applications used in design process 61 without deviating from the scope and spirit of the invention. The design structure of the invention is not limited to any specific design flow.

Design process 61 preferably translates an embodiment of the invention as shown in one or more of FIGS. 1A-3B, along with any additional integrated circuit design or data (if applicable), into a second design structure 70. Design structure 70 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 70 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in one or more of FIGS. 1A-3B. Design structure 70 may then proceed to a stage 71 where, for example, design structure 70: proceeds to tape-out, is released to manufacturing, is released to a mask house, is sent to another design house, is sent back to the customer, etc.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A persistent current switch circuit, comprising:
   a heating element; and
   a switch element located proximate to the heating element, the switch element being substantially formed from a material which exhibits a superconducting temperature value below a superconducting temperature value exhibited by a material used to provide a connection to the switch element;
   wherein the switch element is responsive to the heating element such that the heating element is used to control whether or not the switch element is in a superconducting state.

2. The persistent current switch of claim 1, wherein the material of the switch element exhibits a superconducting temperature value that is at least about half of the superconducting temperature value exhibited by the material used to provide the connection to the switch element.

3. The persistent current switch of claim 1, wherein the material of the switch element comprises titanium.

4. The persistent current switch of claim 1, wherein the material used to provide a connection to the switch element comprises aluminum.

5. The persistent current switch circuit of claim 1, wherein the switch element is formed to minimize an inductance value associated therewith.

6. The persistent current switch circuit of claim 5, wherein the inductance value of the switch element is minimized by forming the switch element in accordance with a folded geometry.

7. The persistent current switch circuit of claim 1, wherein the heating element is substantially formed from a combination of gold and palladium.

8. An apparatus, comprising:
   a heating element; and
   a switch element located proximate to the heating element, the switch element being substantially formed from a material which exhibits a superconducting temperature value below a superconducting temperature value exhibited by a material used to form a connection element that provides a connection to the switch element;
   wherein the switch element is responsive to the heating element such that the heating element is used to control whether or not the switch element is in a superconducting state.

9. The apparatus of claim 8, further comprising a coupling element operatively coupled across the switch element.

10. The apparatus of claim 9, further comprising a device operatively coupled to the coupling element.

11. The apparatus of claim 10, wherein the superconducting temperature value of the material of the switch element is higher than an operating temperature value of the device.

12. The apparatus of claim 10, wherein the device comprises a quantum computation device.

13. The apparatus of claim 10, wherein the heating element and the switch element are formed on a first substrate and the coupling element and the device are formed on a second substrate.

14. The apparatus of claim 10, wherein a first current is applied to the heating element until the switch element is warmed above the superconducting temperature value associated therewith.

15. The apparatus of claim 14, wherein a control signal receivable by the connection element is turned on thereby flowing substantially entirely through the coupling element.

16. The apparatus of claim 15, wherein the first current applied to the heating element is removed and the switch element closes when the switch element cools below its superconducting temperature value thereby allowing a second current to flow persistently through the switch element and the coupling device, and thus allowing an operating characteristic associated with the device to be maintained.

17. An integrated circuit, comprising:
   a substrate layer;
   a heating element layer formed on the substrate layer; and
   a switch element layer formed proximate to the heating element layer, the switch element layer being substantially formed from a material which exhibits a superconducting temperature value below a superconducting temperature value exhibited by a material used to provide a connection to the switch element;
   wherein the switch element layer is responsive to the heating element layer such that the heating element layer is used to control whether or not the switch element layer is in a superconducting state.

18. The integrated circuit of claim 17, wherein the switch element is substantially formed from titanium and the heating element layer is substantially formed from a combination of gold and palladium.

19. The integrated circuit of claim 17, further comprising an insulator layer formed between the heating element layer and the switch element layer.

20. The integrated circuit of claim 19, wherein the insulator layer is substantially formed from silicon nitride.

21. The integrated circuit of claim 17, further comprising two balanced heater current wiring paths formed on the substrate.

22. The integrated circuit of claim 21, wherein the two balanced heater current wiring paths are substantially formed from niobium.

23. The integrated circuit of claim 17, wherein the heating element layer and the switch element layer are formed so as to allow external connections via aluminum wire bonds.

24. A method, comprising:
- applying a first current to a heating element located proximate to a substantially titanium-formed switch element such that the switch element is warmed above a superconducting transition temperature associated therewith;
- introducing a control signal such that the control signal flows substantially entirely through a coupling element operatively coupled to the switch element; and
- removing the first current applied to the heating element such that the switch element closes when the switch element cools below the superconducting transition temperature thereby allowing a second current to flow persistently through the switch element and the coupling device, and thus allowing an operating characteristic associated with a device operatively coupled to the coupling element to be maintained.

25. A design structure embodied in a machine readable medium, the design structure comprising:
- a heating element; and
- a switch element located proximate to the heating element, the switch element being substantially formed from a material which exhibits a superconducting temperature value below a superconducting temperature value exhibited by a material used to provide a connection to the switch element;
- wherein the switch element is responsive to the heating element such that the heating element is used to control whether or not the switch element is in a superconducting state.

* * * * *